(12) United States Patent
Yoon et al.

(10) Patent No.: US 10,210,936 B2
(45) Date of Patent: Feb. 19, 2019

(54) NONVOLATILE MEMORY DEVICE AND A METHOD OF READING THE SAME

(71) Applicant: SAMSUNG ELECTRONICS CO., LTD., Suwon-si, Gyeonggi-do OT (KR)

(72) Inventors: Hyun Jun Yoon, Changwon-si (KR); Ji-Sang Lee, Iksan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/398,014

(22) Filed: Jan. 4, 2017

(65) Prior Publication Data

US 2017/0200502 A1     Jul. 13, 2017

(30) Foreign Application Priority Data

Jan. 11, 2016  (KR) .......................... 10-2016-0003319

(51) Int. Cl.
| | |
|---|---|
| *G11C 16/08* | (2006.01) |
| *G11C 16/26* | (2006.01) |
| *G11C 16/32* | (2006.01) |
| *G11C 16/20* | (2006.01) |

(52) U.S. Cl.
CPC ............. *G11C 16/08* (2013.01); *G11C 16/26* (2013.01); *G11C 16/32* (2013.01); *G11C 16/20* (2013.01)

(58) Field of Classification Search
CPC ................................ G11C 16/08; G11C 16/20
USPC ..................................................... 365/185.12
See application file for complete search history.

(56) References Cited

U.S. PATENT DOCUMENTS

| | | | |
|---|---|---|---|
| 7,035,144 B2 | 4/2006 | Kim et al. | |
| 7,679,133 B2 | 3/2010 | Son et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,976,591 B2 | 3/2015 | Nam et al. | |
| 9,201,789 B1 * | 12/2015 | Kang ................. | G06F 12/0246 |
| 9,349,471 B2 * | 5/2016 | Yun ..................... | G11C 16/3431 |
| 2008/0235442 A1 * | 9/2008 | Chae ................... | G06F 12/0893 |
| | | | 711/103 |
| 2011/0233648 A1 | 9/2011 | Seol et al. | |
| 2013/0279262 A1 * | 10/2013 | Yoon .................. | G11C 16/0483 |
| | | | 365/185.18 |

(Continued)

FOREIGN PATENT DOCUMENTS

| | | |
|---|---|---|
| KR | 1020130080205 | 7/2013 |
| KR | 1020140093855 | 7/2014 |
| KR | 1020150031778 | 3/2015 |

*Primary Examiner* — Huan Hoang
*Assistant Examiner* — Muna A Techane
(74) *Attorney, Agent, or Firm* — F. Chau & Associates, LLC (57) ABSTRACT

A nonvolatile memory device includes a memory cell array including a plurality of memory cells, an address decoder configured to be connected to the memory cells through a plurality of word lines and to provide select or unselect read voltages to the word lines, and a control logic configured to control the address decoder to perform a plurality of read sequences in a continuous read mode and to adjust a word line setup start point in at least one of the read sequences to be different than a word line setup start point in at least one of the other read sequences, wherein the word line setup start point is a time at which the select or unselect read voltages begin to be provided to the word lines.

20 Claims, 8 Drawing Sheets

(56) References Cited

U.S. PATENT DOCUMENTS

| | | | |
|---|---|---|---|
| 2014/0204684 A1* | 7/2014 | Kwak | G11C 7/10 365/189.05 |
| 2014/0269127 A1 | 9/2014 | Hung et al. | |
| 2015/0078095 A1 | 3/2015 | Park et al. | |
| 2015/0221351 A1 | 8/2015 | Park et al. | |
| 2015/0221387 A1 | 8/2015 | Nam | |

* cited by examiner

NONVOLATILE MEMORY DEVICE AND A METHOD OF READING THE SAME

CROSS-REFERENCE TO RELATED APPLICATION

This U.S. non-provisional patent application claims priority under 35 U.S.C. § 119 to Korean Patent Application No. 10-2016-0003319, filed on Jan. 11, 2016, the disclosure of which is incorporated by reference herein in its entirety.

Technical Field

The inventive concept relates to semiconductor memories, and mor particularly, to a nonvolatile memory device and a method of reading the same.

Discussion of Related Art

A semiconductor memory device may be classified as a volatile memory device or a nonvolatile memory device.

A volatile memory device retains its contents when powered on but when its power is interrupted the stored data is lost very rapidly or immediately. A nonvolatile memory device can retrieve stored data even after having been power cycled (e.g., turned off and back on).

Examples of a nonvolatile memory device include a mask read-only memory (MROM), a programmable read-only memory (PROM), an erasable programmable read-only memory (EPROM), an electrically erasable programmable read-only memory (EEPROM), etc.

In a flash memory device, a memory cell may store more than a single bit of information. A memory cell storing 1-bit data is called a single-bit cell or a single-level cell (SLC). A memory cell storing multi-bit data (e.g., two or more bits) is called a multi-bit cell, a multi-level cell (MLC), or a multi-state cell.

SUMMARY

An exemplary embodiment of the inventive concept provides a nonvolatile memory device. The nonvolatile memory device may include a memory cell array including a plurality of memory cells, an address decoder configured to be connected to the memory cells through a plurality of word lines and to provide select or unselect read voltages to the word lines, and a control logic configured to control the address decoder to perform a plurality of read sequences in a continuous read mode and to adjust a word line setup start point in at least one of the read sequences to be different than a word line setup start point in at least one of the other read sequences, wherein the word line setup start point is a time at which the select or unselect read voltages begin to be provided to the word lines.

An exemplary embodiment of the inventive concept provides a nonvolatile memory device. The nonvolatile memory device may include a memory cell array including a plurality of memory cells, an address decoder configured to be connected to the memory cells through a plurality of word lines and to provide select or unselect read voltages to the word lines, and a control logic configured to determine whether a read mode is a single read mode or a continuous read mode in response to a read command. The control logic controls the address decoder to perform a plurality of read sequences in the continuous read mode, and adjusts a word line setup start point in at least one of the read sequences to be different from that in the single read mode, wherein the word line setup start point is a time at which the select or unselect read voltages begin to be provided to the word lines.

An exemplary embodiment of the inventive concept provides a nonvolatile memory device. The nonvolatile memory device may include a memory cell array having a plurality of memory cells connected to word lines; an address decoder connected to the memory cell array via the word lines; and a control circuit configured to control the address decoder to perform a single read mode operation with respect to the memory cell array in response to a first read command and a continuous read mode operation with respect to the memory cell array in response to a second read command, wherein the control circuit is configured to decrease a page buffer initialization sequence of at least one of a plurality of read sequences in the continuous read mode operation.

BRIEF DESCRIPTION OF THE DRAWINGS

The above and other features of the inventive concept will become more apparent by describing in detail exemplary embodiments thereof with reference to the accompanying drawings.

DETAILED DESCRIPTION OF THE EMBODIMENTS

Below, example embodiments of inventive concepts will now be described more fully so that those skilled in the art can easily comprehend the inventive concepts.

In an exemplary embodiment of the present inventive concept, a three dimensional (3D) memory array is provided. The 3D memory array may be monolithically formed in one or more physical levels of arrays of memory cells having an active area disposed above a silicon substrate and circuitry associated with the operation of those memory cells, whether such associated circuitry is above or within such substrate. The term "monolithic" may mean that layers of each level of the array are directly deposited on the layers of each underlying level of the array.

In an exemplary embodiment of the present inventive concept, the 3D memory array includes vertical NAND strings that are vertically oriented such that at least one memory cell is located over another memory cell. The at least one memory cell may comprise a charge trap layer.

Each vertical NAND string may include at least one select transistor located over memory cells, the at least one select transistor having the same structure with the memory cells and being formed monolithically together with the memory cells.

The following patent documents, which are incorporated by reference herein in their entireties, describe configurations of three-dimensional memory arrays, in which a three-dimensional memory array is configured in a plurality of levels, with word lines and/or bit lines shared between the levels: U.S. Pat. Nos. 7,679,133; 8,553,466; 8,654,587; 8,559,235; and U.S. Pat. Pub. No. 2011/0233648.

Figure 1:
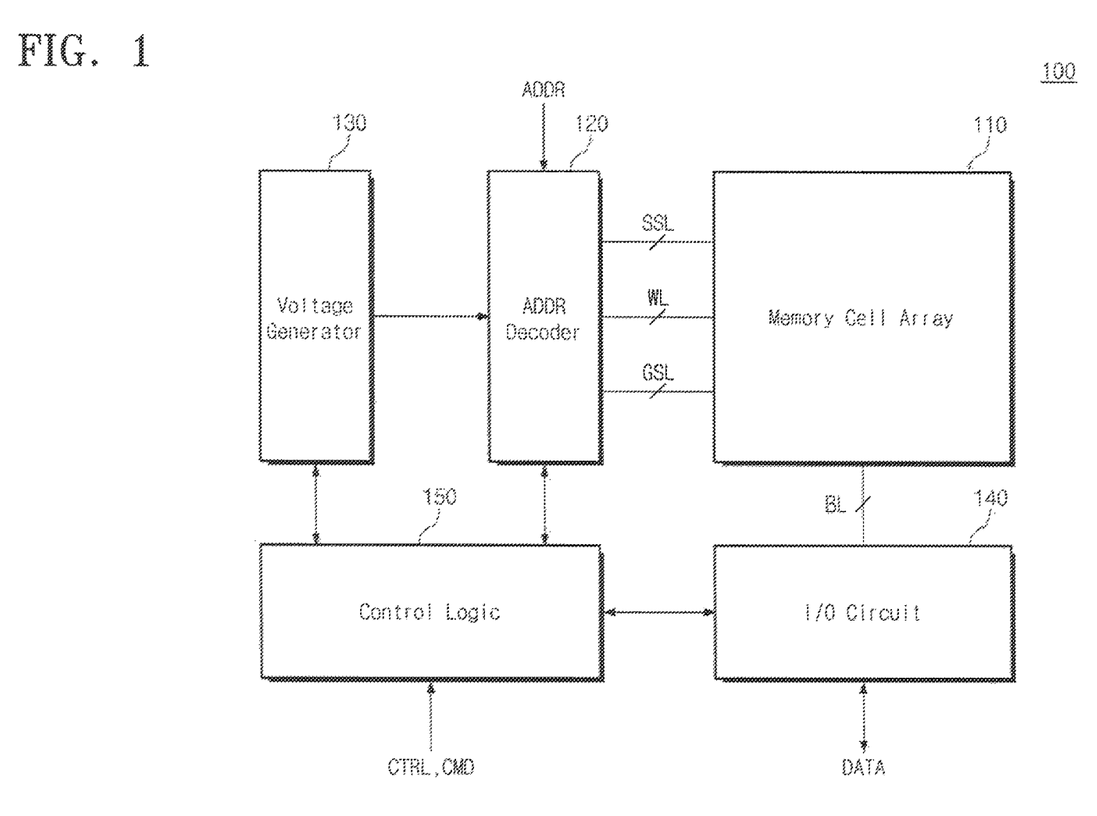
FIG. 1 is a block diagram illustrating a nonvolatile memory device in accordance with an exemplary embodiment of the inventive concept.

FIG. 1 is a block diagram illustrating a nonvolatile memory device in accordance with an exemplary embodiment of the inventive concept. Referring to FIG. 1, a nonvolatile memory device 100 may include a memory cell array 110, an address decoder 120, a voltage generator 130, an input/output circuit 140, and a control logic 150.

The memory cell array 110 is connected to the address decoder 120 through string select lines SSL, word lines WL, and ground select lines GSL, and is connected to the input/output circuit 140 through bit lines BL. The memory cell array 110 may include a plurality of memory blocks. Memory cells of each memory block may form a two-dimensional structure. Memory cells of each memory block may also be laminated (e.g., stacked) in a direction perpendicular to a substrate to form a three-dimensional structure. Each memory block may include a plurality of memory cells and a plurality of select transistors. The memory cells may be connected to the word lines WL and the select transistors may be connected to the string select lines SSL or the ground select lines GSL. Memory cells of each memory block may store one or more bits. In other words, the memory cells may be single-level cells or multi-level cells The address decoder 120 is connected to the memory cell array 110 through the string select lines SSL, the word lines WL, and the ground select lines GSL. The address decoder 120 is configured to operate in response to a control of the control logic 150. The address decoder 120 receives an address ADDR from the outside.

The address decoder 120 is configured to decode a row address among received addresses. The address decoder 120 selects string select lines SSL, word lines WL, and ground select lines GSL using the decoded row address. The address decoder 120 can receive various voltages from the voltage generator 130 and transmit the received voltages to string select lines SSL, word lines WL and ground select lines GSL that are selected and unselected, respectively.

The address decoder 120 may be configured to decode a column address among the transmitted addresses. The decoded column address may be transmitted to the input/output circuit 140. The address decoder 120 may include circuit elements such as a row decoder, a column decoder, an address buffer, etc.

The voltage generator 130 is configured to generate various voltages used in the nonvolatile memory device 100. For example, the voltage generator 130 can generate a plurality of program voltages, a plurality of pass voltages, a plurality of verify voltages, a plurality of select read voltages, and a plurality of unselect read voltages.

The input/output circuit 140 may be connected to the memory cell array 110 through bit lines BL and exchange data with the outside. The input/output circuit 140 operates in response to a control of the control logic 150.

The input/output circuit 140 receives data DATA from the outside and writes the received data DATA in the memory cell array 110. The input/output circuit 140 reads data DATA from the memory cell array 110 and transmits the read data DATA to the outside. The input/output circuit 140 can read data from a first storage area of the memory cell array 110 and write the read data in a second storage area of the memory cell array 110. For example, the input/output circuit 140 may be configured to perform a copy-back operation.

The input/output circuit 140 may include circuit elements such as a page buffer (or page register), a column select circuit, a data buffer, etc. The input/output circuit 140 may also include circuit elements such as a sense amplifier, a write driver, a column select circuit, a data buffer, etc.

The control logic 150 may be connected to the address decoder 120, the voltage generator 130, and the input/output circuit 140. The control logic 150 is configured to control an overall operation of the nonvolatile memory device 100. The control logic 150 operates in response to a control signal CTRL and a command CMD transmitted from a controller. In a read operation, the control logic 150 can determine whether the read operation is performed in a single read mode or a continuous read mode based on the received command CMD. For example, the control logic 150 can control the nonvolatile memory device 100 to operate in the single read mode or the continuous read mode depending on a determination result.

In the single read mode, the nonvolatile memory device 100 can output data DATA corresponding to a command CMD received according to a read sequence. For example, in the single read mode, a read sequence may include a page buffer initialization section, a read operation section, a recovery section, and a dumping section. In the single read mode, the nonvolatile memory device 100 may begin a setup of word lines at the start time of the page buffer initialization section. For example, the word line setup (WL setup) may mean that a select read voltage begins to be applied to a selected word line and an unselect read voltage begins to be applied to an unselected word line.

In the continuous read mode, the nonvolatile memory device 100 can output data DATA corresponding to a plurality of commands CMD received according to a plurality of read sequences. For example, in the continuous read mode, each read sequence may include a page buffer initialization section, a read operation section, a recovery section, and a dumping section. The nonvolatile memory device 100 according to an exemplary embodiment of the inventive concept can control a word line setup (WL setup) in at least one read sequence in the continuous read mode to begin earlier than a word line setup (WL setup) in the single read mode. Thus, the nonvolatile memory device 100 can reduce a page buffer initialization time in the at least one read sequence. As a result, the nonvolatile memory device 100 can increase a read speed in the continuous read mode.

Figure 2:
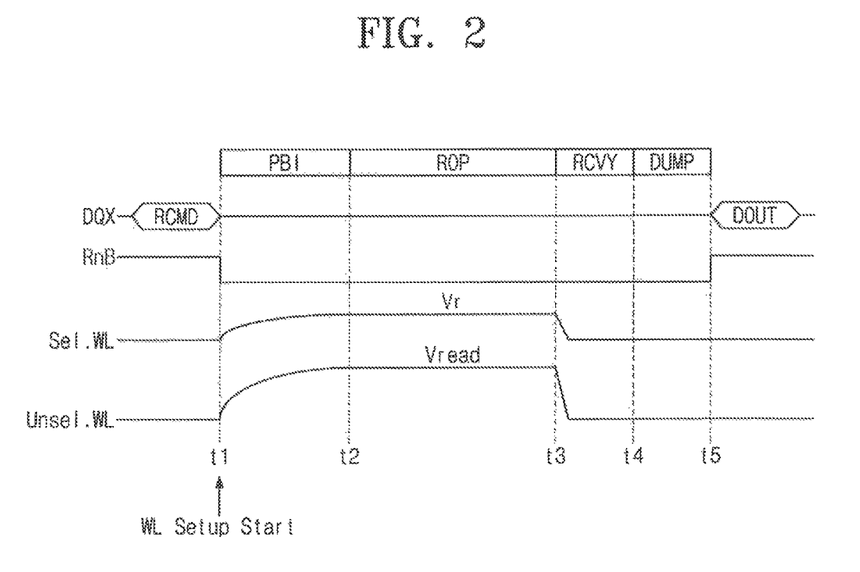
FIG. 2 is a timing diagram illustrating a read sequence in a single read mode in accordance with an exemplary embodiment of the inventive concept.

FIG. 2 is a timing diagram illustrating a read sequence in a single read mode in accordance with an exemplary embodiment of the inventive concept. Referring to FIG. 2, the nonvolatile memory device 100 can receive a read command RCMD to output read data DOUT corresponding to the read command RCMD. For example, one read sequence may include a page buffer initialization section PBI, a read operation section ROP, a recovery section RCVY and a dumping section DUMP.

The nonvolatile memory device 100 can initialize a voltage level of a page buffer to a specific level during the page buffer initialization section PBI. For example, the nonvolatile memory device 100 can initialize the page buffer to a ground voltage. The nonvolatile memory device 100 can also precharge bit lines BL.

The nonvolatile memory device 100 can read data of memory cells selected during the read operation section ROP. For example, the nonvolatile memory device 100 may apply an unselect read voltage Vread to a selected string select line SSL and a ground select line GSL. The nonvolatile memory device 100 may also apply the unselect read voltage Vread to unselected word lines (Unsel. WL). Thus, a channel may be formed in a selected string. In this case, the nonvolatile memory device 100 may apply a select read voltage Vr to a selected word line (Sel. WL). The nonvolatile memory device 100 can store the read data DOUT in a data latch of the page buffer.

The nonvolatile memory device 100 can initialize a voltage pump and word lines WL during the recovery section RCVY. For example, the nonvolatile memory device 100 can change a voltage level of the voltage pump into the ground voltage. The nonvolatile memory device 100 can change voltage levels of word lines WL into the ground voltage.

The nonvolatile memory device 100 can move the read data DOUT from a data latch of the page buffer to a cache latch of the page buffer during the dumping section DUMP. The nonvolatile memory device 100 can output the read data DOUT moved to the cache latch after the dumping section DUMP.

An RnB signal may have a high level while a signal is input to or output from the nonvolatile memory device 100. For example, the RnB signal may have a high level while receiving the read command RCMD. The RnB signal may have a high level while outputting the read data DOUT. The RnB signal may have a low level during the page buffer initialization section PBI, the read operation section ROP, the recovery section RCVY and the dumping section DUMP.

A word line setup start point (WL Setup Start) at which a voltage begins to be applied to the selected and unselected word lines (Sel. WL, Unsel. WL) may be the same as a start time of the page buffer initialization section PBI (e.g., t1). The read operation section ROP may begin after voltages of the selected and unselected word lines increase to select and unselect read voltages Vr and Vread respectively (e.g., t2). In other words, the page buffer initialization section PBI can be maintained until the voltages of the selected and unselected word lines (Sel. WL, Unsel. WL) increase to the select and unselect read voltages Vr and Vread respectively. The recovery section RCVY may begin when the read operation section ROP ends (e.g., t3), the dumping section DUMP may begin when the recovery section RCVY ends (e.g., t4), and the read data DOUT may be output after the dumping section DUMP ends (e.g., t5).

Figure 3:
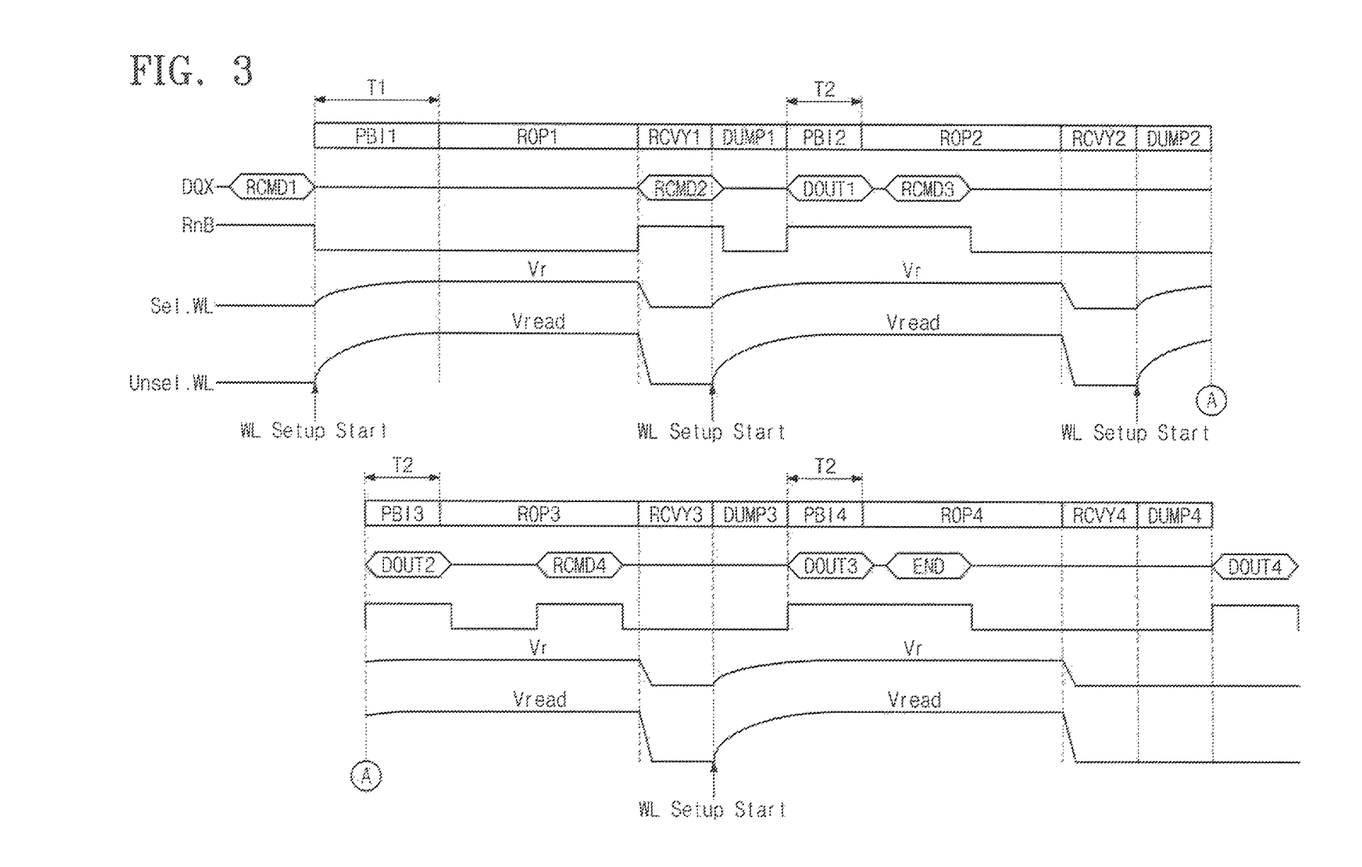
FIG. 3 is a timing diagram illustrating read sequences in a continuous read mode in accordance with an exemplary embodiment of the inventive concept.

FIG. 3 is a timing diagram illustrating read sequences in a continuous read mode in accordance with an exemplary embodiment of the inventive concept. Referring to FIG. 3, the nonvolatile memory device 100 can receive a plurality of read commands RCMD1~RCMD4 to output read data DOUT1~DOUT4 corresponding to the respective read commands RCMD1~RCMD4. The nonvolatile memory device 100 can output the read data DOUT1~DOUT4 according to a plurality of read sequences in the continuous read mode. For example, a first read sequence may include a first page buffer initialization section PBI1, a first read operation section ROP1, a first recovery section RCVY1, and a first dumping section DUMP1. A second read sequence may include a second page buffer initialization section PBI2, a second read operation section ROP2, a second recovery section RCVY2, and a second dumping section DUMP2. A third read sequence may include a third page buffer initialization section PBI3, a third read operation section ROP3, a third recovery section RCVY3, and a third dumping section DUMP3. A fourth read sequence may include a fourth page buffer initialization section PBI4, a fourth read operation section ROP4, a fourth recovery section RCVY4, and a fourth dumping section DUMP4. There is illustrated in FIG. 3 that the nonvolatile memory device 100 processes four read commands in the continuous read mode. However, the inventive concept is not limited thereto. For example, the nonvolatile memory device 100 can consecutively perform at least two read sequences in the continuous read mode.

The nonvolatile memory device 100 can receive the first read command RCMD1. The nonvolatile memory device 100 can receive the second read command RCMD2 during a first read sequence corresponding to the first read command RCMD1. For example, the nonvolatile memory device 100 can receive the second read command RCMD2 during the first recovery section RCVY1. The nonvolatile memory device 100 can output the first read data DOUT1 after the first dumping section DUMP1. The nonvolatile memory device 100 can receive the third read command RCMD3 after outputting the first read data DOUT1. For example, the nonvolatile memory device 100 can receive the third read command RCMD3 during the second read operation section ROP2. The nonvolatile memory device 100 can output the second read data DOUT2 after the second dumping section DUMP2. The nonvolatile memory device 100 can receive the fourth read command RCMD4 after outputting the second read data DOUT2. For example, the nonvolatile memory device 100 can receive the fourth read command RCMD4 during the third read operation section ROP3. The nonvolatile memory device 100 can output the third read data DOUT3 after the third dumping section DUMP3. The nonvolatile memory device 100 can receive an end command END after outputting the third read data DOUT3. For example, the nonvolatile memory device 100 can receive the end command END during the fourth read operation section ROP4. The nonvolatile memory device 100 can finish a read sequence of a continuous read mode according to the end command END. For example, the nonvolatile memory device 100 can output the fourth read data DOUT4 after the fourth dumping section DUMP4 according to the end command END.

An RnB signal may have a high level while a signal is input to or output from the nonvolatile memory device 100. For example, the RnB signal may have a high level while receiving the read commands RCMD1~RCMD4. The RnB signal may have a high level while outputting the read data DOUT1~DOUT4. The RnB signal may have a high level while receiving the end command END. The RnB signal may have a low level during the page buffer initialization sections PBI, the read operation sections ROP, the recovery sections RCVY, and the dumping sections DUMP.

In the first read sequence, a word line setup (WL Setup) may begin at a start time of the first page buffer initialization section PBI1. Thus, the first page buffer initialization section PBI1 may be performed during a first time interval T1. In the second through fourth read sequences, word line setups (WL Setup) may begin at respective start times of the first through third dumping sections DUMP1~DUMP3. Thus, the second through fourth page buffer initialization sections PBI2~PBI4 may be performed during a second time interval T2 respectively. The second time interval T2 is shorter than the first time interval T1.

The nonvolatile memory device 100 can control a word line setup (WL Setup) in at least one read sequence in the continuous read mode to begin earlier than a word line setup (WL Setup) in the single read mode. Thus, the nonvolatile memory device 100 can reduce a page buffer initialization time in the at least one read sequence. As a result, the nonvolatile memory device 100 can increase a read speed in the continuous read mode.

Figure 4:
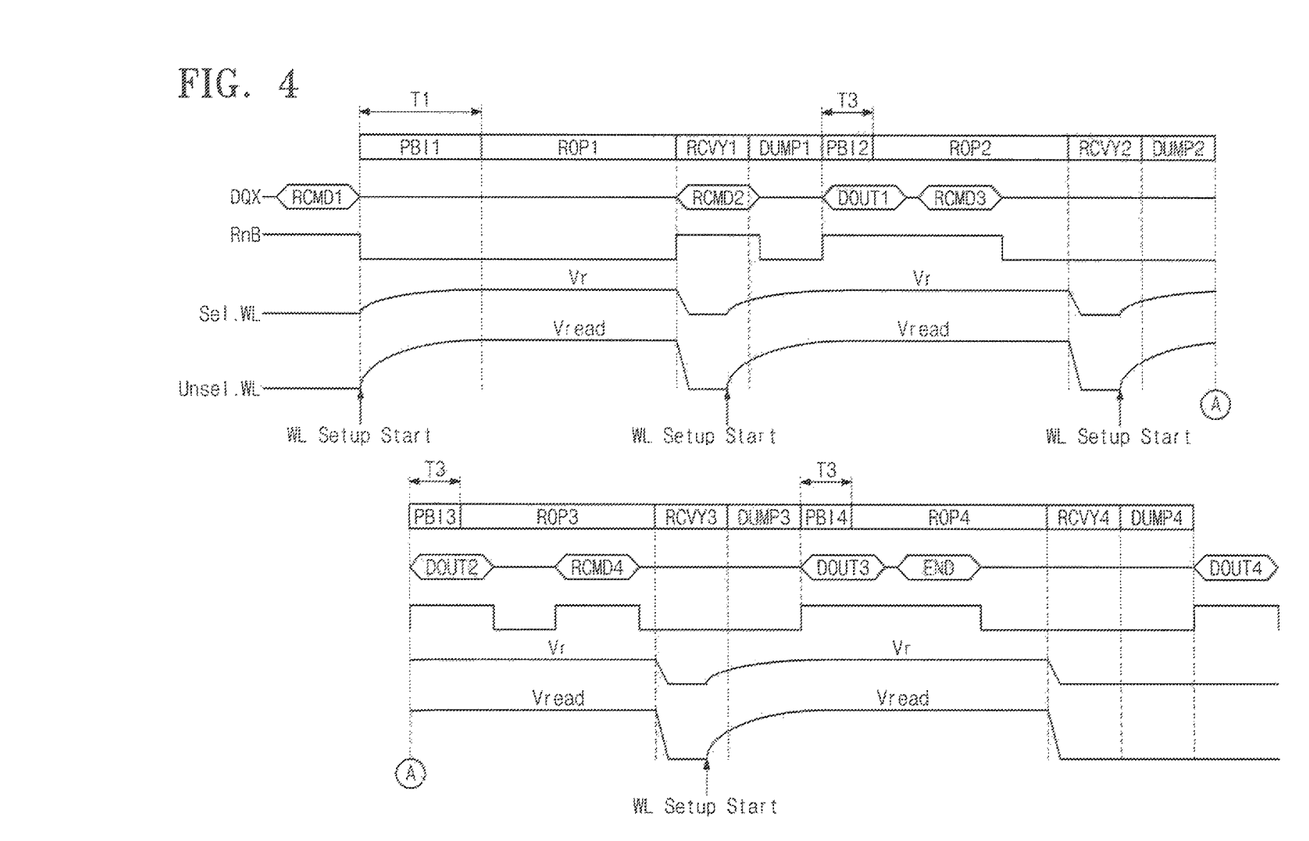
FIG. 4 is a drawing illustrating read sequences in a continuous read mode in accordance with an exemplary embodiment of the inventive concept.

FIG. 4 is a drawing illustrating read sequences in a continuous read mode in accordance with an exemplary embodiment of the inventive concept. Referring to FIG. 4, the nonvolatile memory device 100 can receive a plurality of read commands RCMD1~RCMD4 to output read data DOUT1~DOUT4 corresponding to the respective read commands RCMD1~RCMD4. The nonvolatile memory device 100 can output the read data DOUT1~DOUT4 according to a plurality of read sequences in the continuous read mode. Most of the read sequences of FIG. 4 are similar to the read sequences of FIG. 3. Thus, a description of similar parts is omitted.

In the first read sequence, a word line setup (WL Setup) may begin at a start time of the first page buffer initialization section PBI1. Thus, the first page buffer initialization section PBI1 may be performed during a first time interval T1. In the second through fourth read sequences, word line setups (WL Setup) may begin inside the respective first through third recovery sections RCVY1~RCVY3. Thus, the second through fourth page buffer initialization sections PBI2~PBI4 may be performed during a third time interval T3 respectively. The third time interval T3 is shorter than the first time interval T1. The third time interval T3 is also shorter than the second time interval T2. Thus, in a case of performing a data read operation according to the read sequences of FIG. 4, the nonvolatile memory device 100 can further reduce a reading time compared with the case in which a data read operation is performed according to the read sequences of FIG. 3.

The nonvolatile memory device 100 can control a word line setup (WL Setup) in at least one read sequence in the continuous read mode to begin earlier than a word line setup (WL Setup) in the single read mode. Thus, the nonvolatile memory device 100 can reduce a page buffer initialization time in the at least one read sequence. As a result, the nonvolatile memory device 100 can increase a read speed in the continuous read mode.

Figure 5:
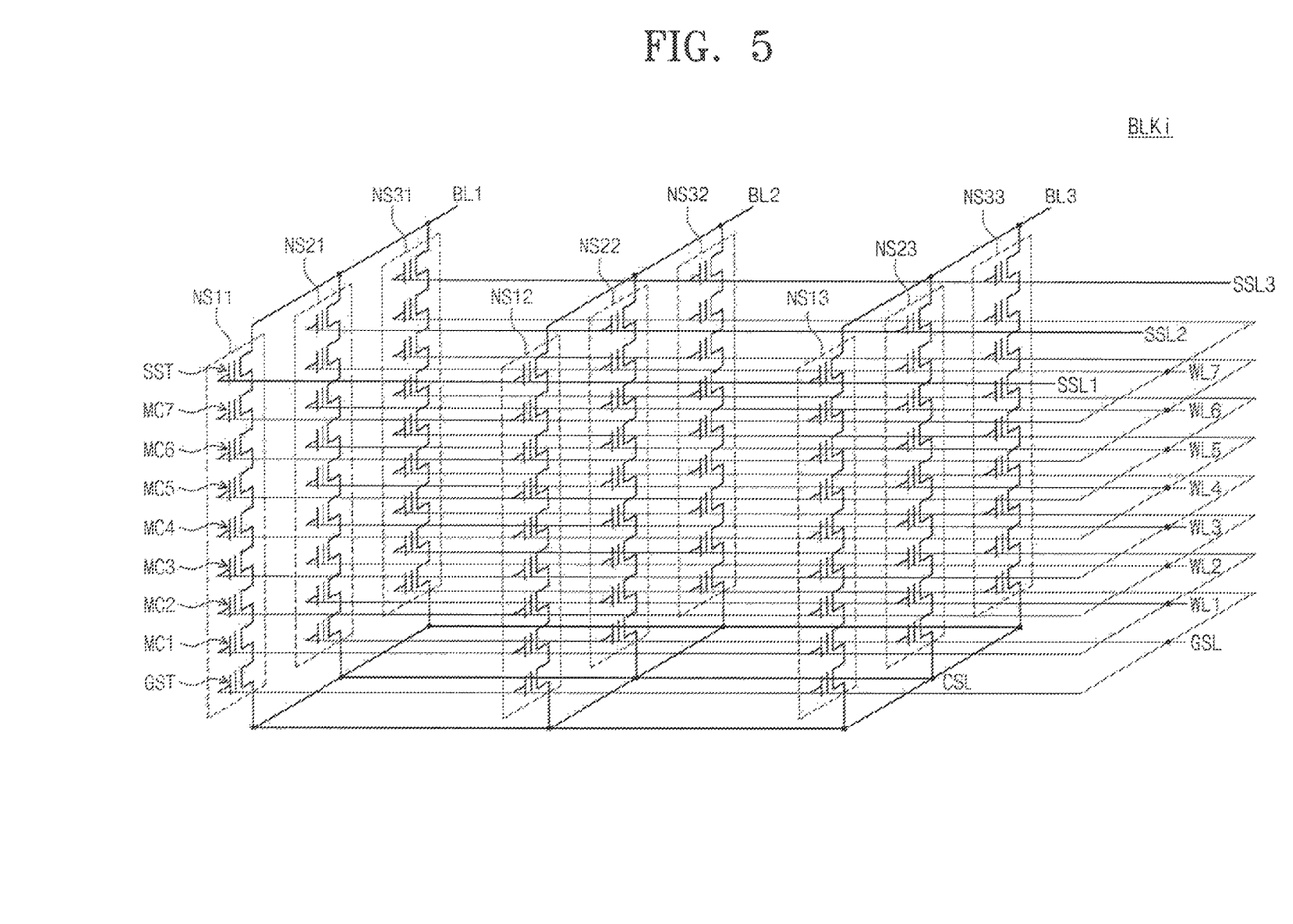
FIG. 5 is a circuit illustrating a memory block among memory blocks of a memory cell array of FIG. 1 according to an exemplary embodiment of the inventive concept.

FIG. 5 is a circuit illustrating a memory block BLKi among memory blocks of the memory cell array 110 of FIG. 1. Referring to FIG. 5, the memory block BLKi may have a three-dimensional structure. For example, NAND strings (NS11, NS21, NS31) may be provided between a first bit line BL1 and a common source line CSL. NAND strings (NS12, NS22, NS32) may be provided between a second bit line BL2 and the common source line CSL. NAND strings (NS13, NS23, NS33) may be provided between a third bit line BL3 and the common source line CSL.

Each NAND string NS may include a string select transistor SST, a ground select transistor GST, and a plurality of memory cells MC (e.g., MC1-MC7) connected between the string select transistor SST and the ground select transistor GST. The string select transistor SST of each NAND string NS may be connected to a corresponding bit line BL. The ground select transistor GST of each NAND string NS may be connected to the common source line CSL.

The NAND strings NS are arranged in units of rows and columns. NAND strings NS connected to one bit line BL in common form one column. For example, NAND strings NS11~NS31 connected to the first bit line BL1 correspond to a first column. NAND strings NS12~NS32 connected to the second bit line BL2 correspond to a second column. NAND strings NS13~NS33 connected to the third bit line BL3 correspond to a third column.

NAND strings NS connected to one string line SSL form one row. For example, the NAND strings NS11~NS13 connected to a first string select line SSL1 form a first row. The NAND strings NS21~NS23 connected to a second string select line SSL2 form a second row. The NAND strings N531~NS33 connected to a third string select line SSL3 form a third row.

In each NAND string NS, a height may be defined. For example, in each NAND string NS, a height of a memory cell MCI adjacent to the ground select transistor GST may be 1. In each NAND string NS, as a memory cell MC gets closer to the string select transistor SST, a height of the memory cell MC increases. For example, in each NAND string NS, a height of a memory cell MC7 adjacent to the string select transistor SST may be 7.

NAND strings NS of the same row share the same string select line SSL. NAND strings NS of different rows are connected to different string select lines SSL respectively. The NAND strings (NS11~NS13, NS21~NS23, NS31~NS33) share a ground select line GSL. Memory cells of the same height of the NAND strings NS of the same row share a word line. At the same height, word lines WL of NAND strings NS of different rows are connected in common. The common source line CSL is connected to the NAND strings NS in common.

As illustrated in FIG. 5, word lines WL of the same height are connected in common. Thus, when a specific word line WL of the word lines WL1-WL7 is selected, all of the NAND strings NS connected to the specific word line WL are selected. NAND strings of different rows are connected to different string select lines SSL. Thus, by selecting the string select lines SSL1~SSL3, NAND strings NS of an unselected row among NAND strings NS connected to the same word line WL may be separated from the bit lines BL1~BL3. In other words, by selecting the string select lines SSL1~SSL3, a row of NAND strings NS may be selected. By selecting the bit lines BL1~BL3, NAND strings NS of a selected row may be selected in units of columns.

Figure 6:
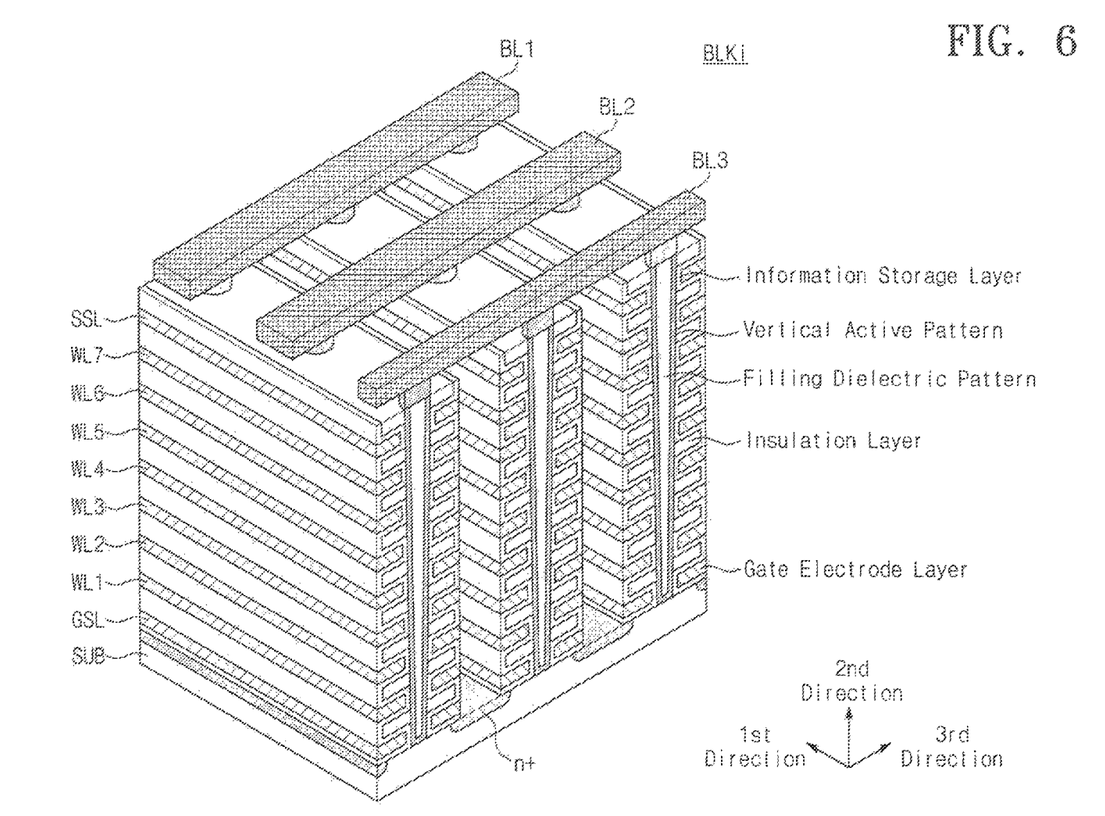
FIG. 6 is a perspective view illustrating a structure of the memory block of FIG. 5 according to an exemplary embodiment of the inventive concept.

FIG. 6 is a perspective view illustrating a structure corresponding to the memory block BLKi of FIG. 5 according to an exemplary embodiment of the inventive concept. Referring to FIG. 6, a memory block BLKi may be formed in a direction perpendicular to a substrate SUB. An n+ doping region may be formed in the substrate SUB.

A gate electrode layer and an insulation layer may be alternately deposited on the substrate SUB. An information storage layer may be formed between the gate electrode layer and the insulation layer. A pillar of a V shape may be formed by patterning the gate electrode layer and the insulation layer in a vertical direction. The pillar may penetrate the gate electrode layer and the insulation layer to connect to the substrate SUB. The inside of the pillar has a filling dielectric pattern and may include an insulating material such as silicon oxide. The outside of the pillar has a vertical active pattern and may be a channel semiconductor.

The gate electrode layer of the memory block BLKi may be connected to a ground select line GSL, a plurality of word lines WL1~WL7, and a string select line SSL.

The pillar of the memory block BLKi may be connected to a plurality of bit lines BL1~BL3. In FIG. 6, the memory block BLKi is illustrated to have two select lines GSL and SSL, seven word lines WL1~WL7, and three bit lines BL1~BL3 but the number of select lines, word lines, and bit lines is not limited thereto.

Figure 7:
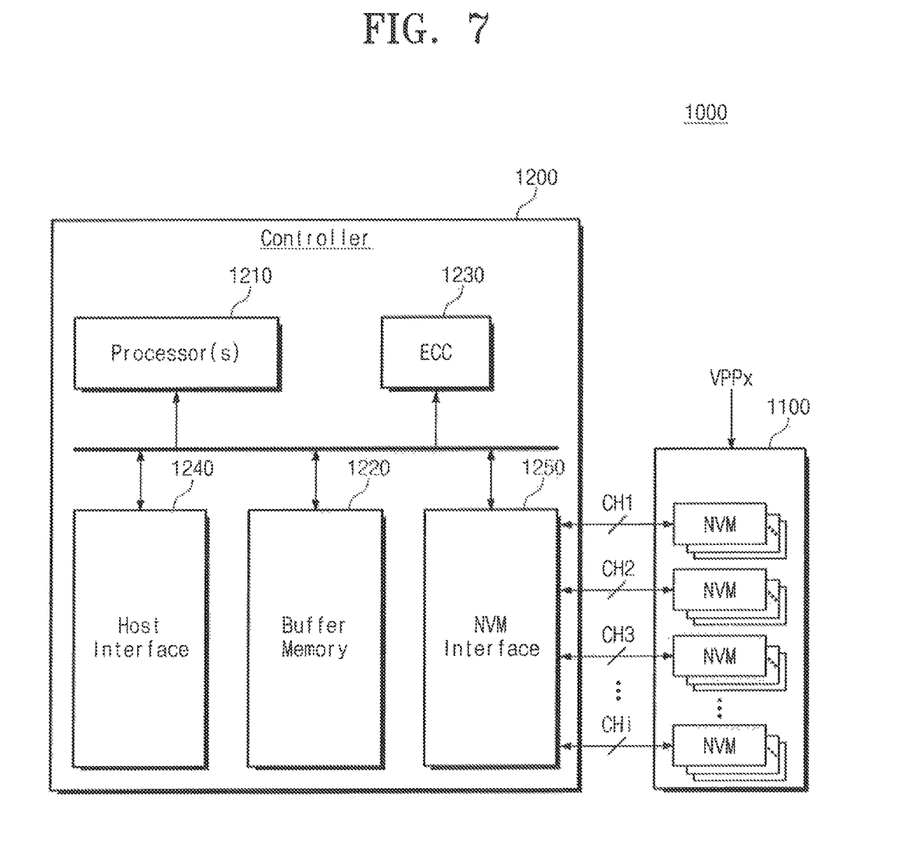
FIG. 7 is a block diagram illustrating a solid state drive in accordance with an exemplary embodiment of the inventive concept.

FIG. 7 is a block diagram illustrating a solid state drive (SSD) in accordance with an exemplary embodiment of the inventive concept. Referring to FIG. 7, an SSD 1000 may include a plurality of nonvolatile memory devices 1100 and an SSD controller 1200.

The nonvolatile memory devices 1100 may selectively receive an external high voltage VPPx. Each of the nonvolatile memory devices 1100, as described in FIGS. 1 through 6, can adjust a word line setup start point in at least one read sequence in a continuous read mode to reduce a read time of data.

The SSD controller 1200 is connected to the nonvolatile memory devices 1100 through a plurality of channels CH1~CHi (i is an integer of 2 or more). The SSD controller 1200 may include at least one processor 1210, a buffer memory 1220, an error correction circuit 1230, a host interface 1240, and a nonvolatile memory interface 1250.

The buffer memory 1220 may temporarily store data used to drive the SSD controller 1200. The buffer memory 1220 may include a plurality of memory lines configured to store data or a command.

The error correction circuit 1230 can calculate an error correction code value of data to be programmed in a write operation, correct an error of data read in a read operation based on the error correction code value, and correct an error of data recovered from the nonvolatile memory devices 1100 in a data recovery operation. A code memory for storing code data used to drive the SSD controller 1200 may be further included. The code memory may be embodied by a nonvolatile memory device.

The host interface 1240 may provide an interface function with an external device. The host interface 1240 may be a NAND interface. The nonvolatile memory interface 1250 may provide an interface function with the nonvolatile memory devices 1100.

Figure 8:
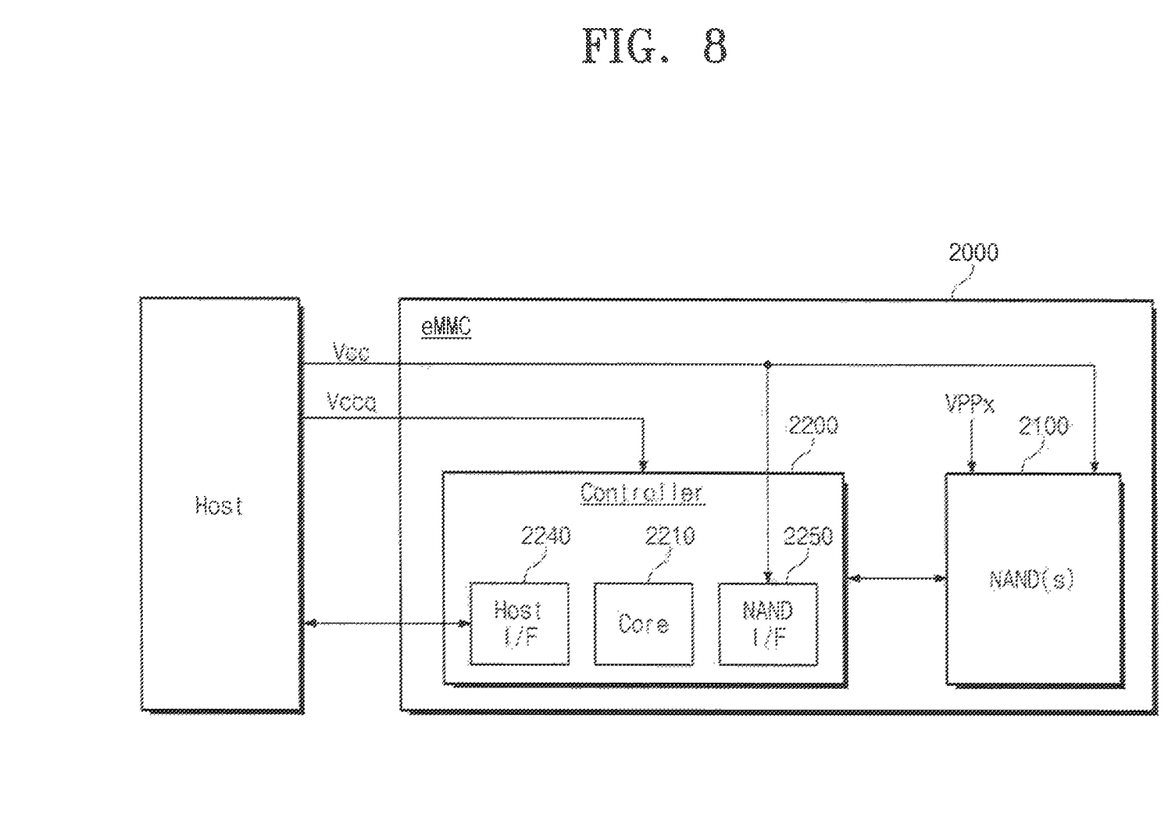
FIG. 8 is a block diagram illustrating an embedded multimedia card (eMMC) in accordance with an exemplary embodiment of the inventive concept.

FIG. 8 is a block diagram illustrating an embedded multimedia card (eMMC) in accordance with an exemplary embodiment of the inventive concept. Referring to FIG. 8, an eMMC 2000 may include at least one NAND flash memory device 2100 and a controller 2200.

The NAND flash memory device 2100 may be a single data rate (SDR) NAND or a double data rate (DDR) NAND. The NAND flash memory device 2100 may be a vertical NAND flash memory device (VNAND). The NAND flash memory device 2100 can adjust a word line setup start point in at least one read sequence in a continuous read mode to reduce a read time of data, as described in FIGS. 1 through 6,.

The controller 2200 may be connected to the NAND flash memory device 2100 through a plurality of channels. The controller 2200 may include at least one controller core 2210, a host interface 2240, and a NAND interface 2250. The at least one controller core 210 can control the entire operation of the eMMC 2000. The host interface 2240 can perform an interface between the controller 2210 and a host. The NAND interface 2250 performs an interface between the NAND flash memory device 2100 and the controller 2200. In an exemplary embodiment of the inventive concept, the host interface 2240 may be a parallel interface (e.g., an MMC interface). In an exemplary embodiment of the inventive concept, the host interface 2240 may be a serial interface (e.g., an ultra high speed (UHS)-II interface, a universal flash storage (UFS) interface, etc.).

The eMMC 2000 may be provided with power supply voltages (Vcc, Vccq) from the host. A first power supply voltage Vcc (e.g., 3.3V) may be provided to the NAND flash memory device 2100 and the NAND interface 2250, and a second power supply voltage Vccq (e.g., 1.8V/3.3V) may be provided to the controller 2200. In an exemplary embodiment of the inventive concept, the eMMC 2000 may be selectively provided with an external high voltage VPPx.

According to an exemplary embodiment of the inventive concept, there may be provided a nonvolatile memory device that controls a word line setup start point in at least one read sequence in a continuous read mode to increase a read speed and a method of reading the same.

While the inventive concept has been described with reference to exemplary embodiments thereof, it will be apparent to those skilled in the art that various changes and modifications may be made thereto without departing from the spirit and scope of the inventive concept.

What is claimed is:

1. A nonvolatile memory device, comprising:
a memory cell array including a plurality of memory cells;
an address decoder configured to be connected to the memory cells through a plurality of word lines and to provide select and unselect read voltages to the word lines; and
a control logic configured to control the address decoder to perform a plurality of read sequences in a continuous read mode and to adjust word line setup start point in at least one of the read sequences to be different than a word line setup start point in at least one of the other read sequences, wherein the word line setup start point is a time at which the select and unselect read voltages begin to be provided to the word lines.

2. The nonvolatile memory device of claim 1, wherein the read sequences comprise a first read sequence and a second read sequence performed after the first read sequence, and
wherein a word line setup of the second read sequence begins before the first read sequence is completed.

3. The nonvolatile memory device of claim 1, wherein the read sequences comprise a first read sequence and a second read sequence performed after the first read sequence,
wherein the first read sequence comprises a first page buffer initialization section, a first read operation section, a first recovery section and a first dumping section, and
wherein the second read sequence comprises a second page buffer initialization section, a second read operation section, a second recovery section and a second dumping section.

4. The nonvolatile memory device of claim 3, wherein a word line setup of the second read sequence begins in the first dumping section.

5. The nonvolatile memory device of claim 3, wherein a word line setup of the second read sequence begins in the first recovery section.

6. The nonvolatile memory device of claim 5, wherein the word line setup of the second read sequence begins after a voltage level of selected or unselected word lines drops towards a ground voltage after the first read operation section.

7. The nonvolatile memory device of claim 3, wherein the first page buffer initialization section is performed during a first time interval, and
wherein the second page buffer initialization section is performed during a second time interval shorter than the first time interval.

8. The nonvolatile memory device of claim 7, wherein the control logic selects a single read mode or the continuous read mode according to a read command.

9. The nonvolatile memory device of claim 8, wherein in the single read mode, a page buffer initialization section is performed during the first time interval.

10. A nonvolatile memory device, comprising:
a memory cell array including a plurality of memory cells;
an address decoder configured to be connected to the memory cells through a plurality of word lines and to provide select and unselect read voltages to the word lines; and
a control logic configured to determine whether a read mode is a single read mode or a continuous read mode in response to a read command,
wherein the control logic controls the address decoder to perform a plurality of read sequences in the continuous read mode, and adjusts a word line setup start point in at least one of the read sequences to be different from that in the single read mode, wherein the word line setup start point is a time at which the select and unselect read voltages begin to be provided to the word lines.

11. The nonvolatile memory device of claim 10, wherein the read sequences in the continuous read mode comprises a first read sequence and a second read sequence performed after the first read sequence, and
wherein a word line setup of the second read sequence begins before the first read sequence is completed.

12. The nonvolatile memory device of claim 10, wherein in the single read mode, a page buffer initialization section is performed during a first time interval, and
wherein in the continuous read mode, at least one page buffer initialization section of the read sequences is performed during a second time interval shorter than the first time interval.

13. The nonvolatile memory device of claim 10, wherein in the continuous read mode, the read sequences comprise a first read sequence and a second read sequence performed after the first read sequence,
wherein the first read sequence comprises a first page buffer initialization section, a first read operation section, a first recovery section and a first dumping section, and
wherein the second read sequence comprises a second page buffer initialization section, a second read operation section, a second recovery section and a second dumping section.

14. The nonvolatile memory device of claim 13, wherein the word line setup of the second read sequence begins in the first dumping section.

15. The nonvolatile memory device of claim 13, wherein the word line setup of the second read sequence begins in the first recovery section.

16. A nonvolatile memory device, comprising:
a memory cell array having a plurality of memory cells connected to word lines;
an address decoder connected to the memory cell array via the word lines; and
a control circuit configured to control the address decoder to perform a single read mode operation with respect to the memory cell array in response to a first read command and a continuous read mode operation with respect to the memory cell array in response to a second read command,
wherein the control circuit is configured to decrease a page buffer initialization time in at least one of a plurality of read sequences in the continuous read mode operation by starting a time at which select and unselect read voltages begin to be increased in one of the plurality of read sequences to be different from that in another of the plurality of read sequences.

17. The nonvolatile memory device of claim 16, wherein in the continuous read mode operation a word line setup start time begins in a dumping section.

18. The nonvolatile memory device of claim 16, wherein in the continuous read mode operation a word line setup start time begins in a recovery section.

19. The nonvolatile memory device of claim 16, wherein a page buffer initialization sequence of the continuous read mode operation is shorter than a page buffer initialization sequence of the single read mode operation.

20. The nonvolatile memory device of claim 16, wherein a word line setup start time of the single read mode begins at a page buffer initialization section of the single read mode and a word line setup start time of the continuous read mode begins prior to a page buffer initialization section of the continuous read mode.

* * * * *